US009117498B2

(12) United States Patent
Ramaraju et al.

(10) Patent No.: US 9,117,498 B2
(45) Date of Patent: Aug. 25, 2015

(54) MEMORY WITH POWER SAVINGS FOR UNNECESSARY READS

(71) Applicants: Ravindraraj Ramaraju, Round Rock, TX (US); George P. Hoekstra, Austin, TX (US); Andrew C. Russell, Austin, TX (US)

(72) Inventors: Ravindraraj Ramaraju, Round Rock, TX (US); George P. Hoekstra, Austin, TX (US); Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 180 days.

(21) Appl. No.: 13/826,427

(22) Filed: Mar. 14, 2013

(65) Prior Publication Data

US 2014/0269131 A1    Sep. 18, 2014

(51) Int. Cl.
*G11C 7/08* (2006.01)
*G11C 8/12* (2006.01)

(52) U.S. Cl.
CPC ... *G11C 7/08* (2013.01); *G11C 8/12* (2013.01)

(58) Field of Classification Search
CPC ........ G06F 3/0625; G11C 5/148; G11C 7/06; G11C 7/062; G11C 7/065; G11C 7/08; G11C 7/12; G11C 7/18; G11C 7/109; G11C 7/1006; G11C 7/1051; G11C 7/1063; G11C 7/1069; G11C 7/1078; G11C 7/4091; G11C 7/4094; G11C 7/4096; G11C 7/4097; G11C 8/08; G11C 8/10; G11C 8/12; G11C 8/14; G11C 11/4091; G11C 11/4094; G11C 11/4096; G11C 11/4097; H03K 19/0175

USPC .............. 326/105; 365/76, 189.05, 191, 194, 365/207, 208, 227, 230.06; 711/101, 102, 711/104, 145, 147, 154

See application file for complete search history.

(56) References Cited

U.S. PATENT DOCUMENTS

| 5,031,153 | A | * | 7/1991 | Suyama ......................... 365/206 |
| 5,459,416 | A | * | 10/1995 | Ghia et al. ....................... 327/34 |
| 5,515,024 | A | * | 5/1996 | Ghia et al. .................. 340/146.2 |
| 5,528,541 | A | * | 6/1996 | Ghia et al. ..................... 365/203 |
| 5,550,774 | A |  | 8/1996 | Brauer et al. |
| 5,642,480 | A | * | 6/1997 | Brownlee et al. ................ 726/26 |
| 5,673,226 | A | * | 9/1997 | Yumitori et al. .............. 365/190 |
| 5,715,426 | A |  | 2/1998 | Takahashi et al. |
| 5,757,690 | A |  | 5/1998 | McMahon |
| 5,848,428 | A |  | 12/1998 | Collins |
| 6,016,534 | A |  | 1/2000 | Kumar et al. |

(Continued)

OTHER PUBLICATIONS

Bharadwaj S. Amrutur and Mark A Horowitz, Aug. 1998, A Replica Technique for Wordline and Sense Control in Low-power SRAM's, IEEE Journal of Solid State Circuits, vol. 33, No. 8, pp. 1208-1219.*

(Continued)

*Primary Examiner* — Hoai V Ho
*Assistant Examiner* — Roberto Mancera

(57) ABSTRACT

A memory device includes a plurality of sense amplifiers, an array of memory cells including a first subset of memory cells, and a plurality of word lines. Each word line is coupled to each memory cell in a respective row of the memory cells and each row of the memory cells includes one memory cell of the first subset of memory cells. Each of a plurality of control word lines is coupled to a respective one of the memory cells in the first subset of memory cells and each of the memory cells in the first subset of memory cells generates a sense amplifier control signal coupled to control operation of a respective one of the plurality of sense amplifiers.

20 Claims, 3 Drawing Sheets

(56) References Cited

U.S. PATENT DOCUMENTS

| | | | |
|---|---|---|---|
| 6,021,461 | A | 2/2000 | Dhong et al. |
| 6,128,213 | A * | 10/2000 | Kang .......................... 365/145 |
| 6,201,757 | B1 * | 3/2001 | Ward et al. ............... 365/230.05 |
| 6,212,117 | B1 * | 4/2001 | Shin et al. .................... 365/205 |
| 6,307,793 | B1 * | 10/2001 | Murakami ............... 365/189.11 |
| 6,351,423 | B2 * | 2/2002 | Ooishi .......................... 365/207 |
| 6,473,356 | B1 * | 10/2002 | Raszka ................... 365/230.03 |
| 6,490,214 | B2 * | 12/2002 | Kawasumi ............... 365/210.12 |
| 6,556,472 | B2 * | 4/2003 | Yokozeki ...................... 365/154 |
| 6,563,758 | B2 * | 5/2003 | Shau ....................... 365/230.05 |
| 6,577,524 | B2 * | 6/2003 | Brooks et al. ................... 365/78 |
| 6,614,690 | B2 * | 9/2003 | Roohparvar ............. 365/185.22 |
| 6,944,713 | B2 | 9/2005 | Clark et al. |
| 7,035,149 | B2 * | 4/2006 | Shimizu ....................... 365/191 |
| 7,215,587 | B2 * | 5/2007 | Lee et al. ...................... 365/200 |
| 7,426,143 | B2 * | 9/2008 | Kim et al. ............... 365/185.22 |
| 7,487,369 | B1 | 2/2009 | Gupta et al. |
| 7,570,525 | B2 * | 8/2009 | Nii et al. ................. 365/189.11 |
| 7,593,276 | B2 * | 9/2009 | Hirabayashi ............... 365/210.1 |
| 7,733,711 | B2 * | 6/2010 | Burnett et al. ........... 365/189.09 |
| 8,014,215 | B2 | 9/2011 | Lee et al. |
| 8,164,942 | B2 * | 4/2012 | Gebara et al. ................. 365/149 |
| 8,279,693 | B2 * | 10/2012 | Wang ............................ 365/205 |
| 8,755,244 | B2 * | 6/2014 | Ashok et al. ............. 365/230.05 |
| 2001/0014036 | A1 | 8/2001 | Rapp |
| 2004/0042275 | A1 * | 3/2004 | Yoshizawa et al. ...... 365/189.07 |
| 2004/0047173 | A1 * | 3/2004 | Kang ............................ 365/145 |
| 2004/0202039 | A1 * | 10/2004 | Takayanagi .................. 365/233 |
| 2005/0018511 | A1 * | 1/2005 | Lee .............................. 365/207 |
| 2007/0030741 | A1 * | 2/2007 | Nii et al. ................. 365/189.11 |
| 2009/0040846 | A1 * | 2/2009 | Chang .......................... 365/194 |
| 2009/0080255 | A1 * | 3/2009 | Arita ........................ 365/185.09 |
| 2010/0246309 | A1 * | 9/2010 | Shimono et al. ......... 365/230.06 |
| 2011/0188295 | A1 * | 8/2011 | Gebara et al. ................. 365/149 |
| 2013/0016572 | A1 * | 1/2013 | Kuroda .................... 365/189.05 |
| 2013/0148411 | A1 * | 6/2013 | Atsumi et al. ................ 365/149 |
| 2013/0182491 | A1 * | 7/2013 | Son et al. ...................... 365/154 |
| 2013/0322190 | A1 * | 12/2013 | Vikash et al. ............ 365/189.16 |
| 2014/0003172 | A1 * | 1/2014 | Ramaraju et al. ............. 365/195 |
| 2014/0010032 | A1 * | 1/2014 | Seshadri et al. .............. 365/203 |
| 2014/0029366 | A1 * | 1/2014 | Trivedi et al. ............... 365/210.1 |
| 2014/0050010 | A1 * | 2/2014 | Toda ............................. 365/148 |

OTHER PUBLICATIONS

Umut Arslan, Mark P. McCartney, Mudit Bhargava, Xin Li, Ken Mai, and Lawrence T. Pileggi, Variation-Tolerant SRAM Sense Amplifier Timing Using Configurable Replica Bitlines, Nov. 24, 2008, IEEE 2008 Custom Integrated Circuits Conference (CICC), pp. 415-418.*

U.S. Appl. No. 13/537,209, Ramaraju, R., et al, "Memory With Word Line Access Control", filed Jun. 29, 2012.

Peng, M., et al., "Low Energy Partial Tag Comparison Cache Using Valid-bit Pre-decision", TENCON, IEEE Region 10 Conference, Nov. 14-17, 2006, pp. 1-4.

Chen, H., et al., "Low-power Way-predicting Cache Using Valid-bit Pre-decision for Parallel Architectures", IEEE, Proceedings of the 19th International Conference on Advanced Information Networking and Applications (AINA '05), Mar. 28-30, 2005, pp. 1-4.

* cited by examiner

MEMORY WITH POWER SAVINGS FOR UNNECESSARY READS

BACKGROUND

1. Field

This disclosure relates generally to semiconductor memories, and more particularly to memories with power control.

2. Related Art

A typical desire for integrated circuits, including memories, is to have reduced power consumption. This may be achieved by disabling portions of the memory during a low power mode, reducing the number of active circuits during normal operation, reducing the power supply voltage, or some combination of these. It is desirable to not reduce the reliability or speed of operation or reliability or use more area. Often it is not possible to achieve all of these objectives. So it may be desirable, for example, to reduce power consumption even if it requires a little more area. The particular application may value an increase speed sufficiently to be worth a corresponding increase in area.

Accordingly there is a need to provide further improvement in reducing power consumption of a memory while addressing one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a memory has a control memory cell along each word line which is set or cleared. In response to a word line being selected, sense amplifiers which read data from memory cells along the selected word line are enabled when the control memory cell has been set. If the bit has been cleared, the sense amplifiers are disabled, which reduces power consumption, especially peak power consumption. This is better understood by reference to the drawings and the following written description.

The terms "assert" or "set" and "negate" (or "deassert" or "clear") are used herein when referring to the rendering of a signal, status bit, or similar apparatus into its logically true or logically false state, respectively. If the logically true state is a logic level one or logic high, the logically false state is a logic level zero or logic low. And if the logically true state is a logic level zero, the logically false state is a logic level one which is indicated by a suffix of "B."

Figure 1:
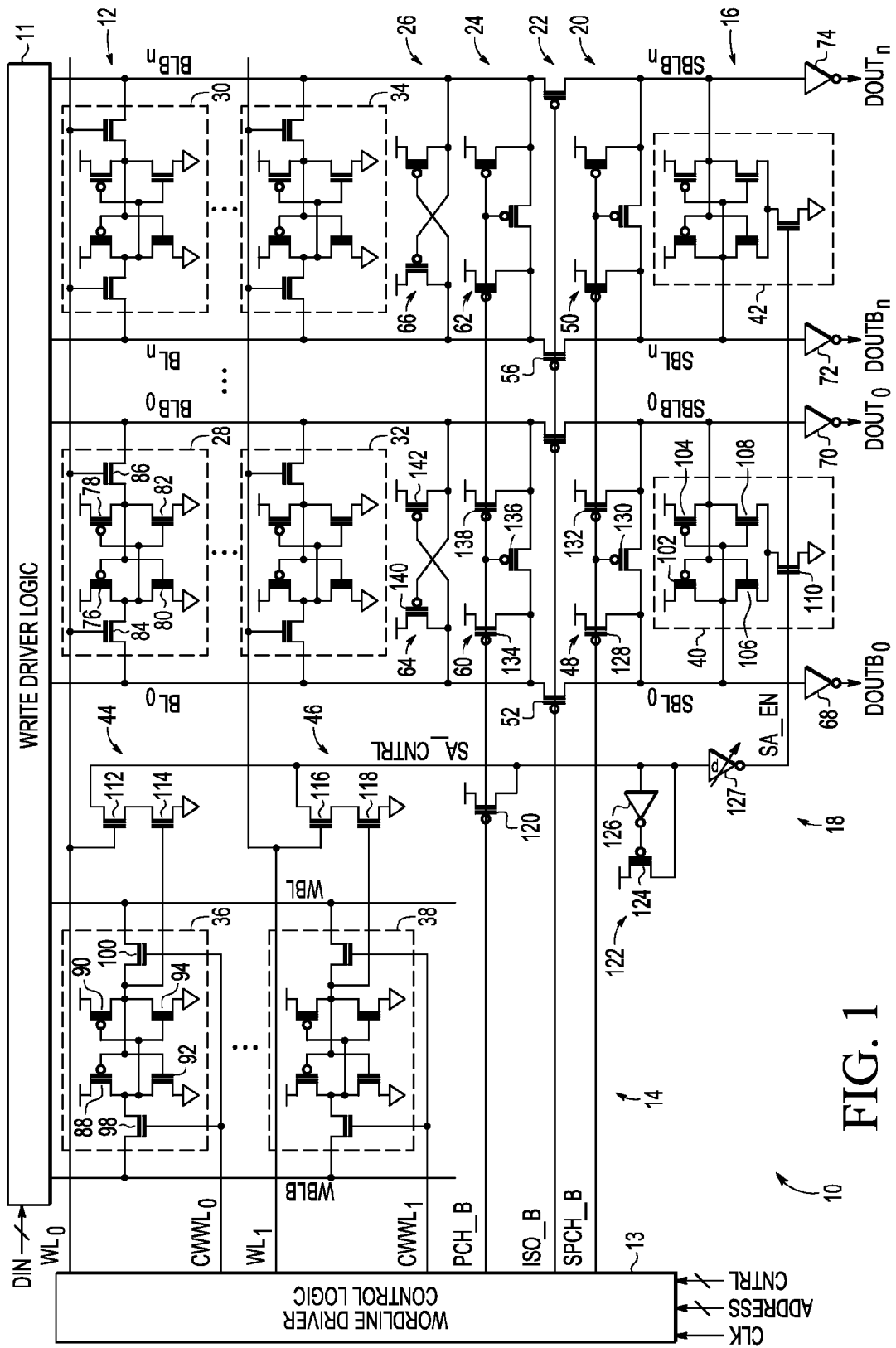
FIG. 1 is a circuit diagram of a memory according to a first embodiment.

Shown in FIG. 1 is a memory 10 comprising an array 12, a plurality of control memory cells 14, a plurality of sense amplifiers 16, a sense amplifier enable circuit 18, a secondary bit line precharge circuit 20, a column coupler circuit 22, a bit line precharge circuit 24, a bit line latch circuit 26, write driver logic 11, and wordline driver control logic 13. Array 12 comprises a memory cell 28 coupled to word line WL0 and true and complementary bit lines BL0 and BLB, a memory cell 30 coupled to word line WL0 and true and complementary bit lines BLn and BLBn, a memory cell 32 coupled to word line WL1 and true and complementary bit lines BL0 and BLB0, and a memory cell 32 coupled to word line WL1 and true and complementary bit lines BLn and BLBn. Plurality of control memory cells 14 comprises a control memory cell 36 coupled to word line WL0 and control write word line CWWL0 and true and complementary write bit lines WBL and WBLB and a control memory cell 38 coupled to word lines WL1 and CWWL0 and true and complementary write bit lines WBL and WBLB. Control memory cells 14 may also be considered a subset of memory cells of array 12. Each row of memory cells has one of this subset. Plurality of sense amplifiers 16 comprises a sense amplifier 40 coupled to secondary true and complementary bit lines SBL0 and SBLB0 and a sense amplifier 42 coupled to secondary true and complementary bit lines SBLn and SBLBn. Sense amplifier enable circuit 18 comprises a detection circuit 44 coupled to control memory cell 36 and a sense amplifier control line SA_CNTRL, a detection circuit 46 coupled to control memory cell 38 and sense amplifier control line SA_CNTRL, a transistor 120 coupled to a precharge line PCH_B and sense amplifier control line SA_CNTRL, a latch 122 coupled to sense amplifier control line SA_CNTRL, and a variable delay inverter 127 having an input coupled to the sense amplifier control line SA_CNTRL and an output coupled to enable inputs of sense amplifiers 40 and 42. Secondary bit line precharge circuit 20 comprises a precharge circuit 48 coupled to a secondary precharge line SPCH_B and secondary bit lines SBL0 and SBLB0 and a precharge circuit 50 coupled to secondary precharge line SPCH_B and secondary bit lines SBL0 and SBLB0. Column coupler circuit 22 comprises transistors 52 and 54 coupled to a line ISO_B and between bit lines BL0 and BLB0 and secondary bit lines SBL0 and SBLB0 and transistors 56 and 58 coupled to line ISO_B and between bit lines BLn and BLBn and secondary bit lines SBLn and SBLBn. Bit line precharge circuit 24 comprises a precharge circuit 60 coupled to precharge line PCH_B and to bit lines BL0 and BLB0 and a precharge circuit 62 coupled to precharge line PCH_B and bit lines BLn and BLBn. Bit line latch circuit 26 comprises a cross coupled latch 64 coupled between bit lines BL0 and BLB0 and a cross coupled latch 66 coupled between bit lines BLn and BLBn. Transistor 120 is a P channel transistor having a source connected to the positive power supply terminal, a gate for receiving precharge signal PCH_B that is asserted as a logic low generated by word line driver control logic 13, and a drain connected to sense amplifier control line SA_CNTRL. Latch 122 comprises P channel transistor 124 and an inverter 126. Transistor 124 has a source connected to the positive power supply terminal, a drain connected to sense amplifier control line SA_CNTRL, and a gate. Inverter 126 has an input connected sense amplifier control line SA_CNTRL and an output connected to the gate of transistor 124.

In this example, memory cells 28, 30, 32, and 34 are conventional static random access memory (SRAM) cells. For example, memory cell 28 comprises a P channel transistor 76 and a P channel transistor 78 that function as pull-up transistors, an N channel transistor 80 and an N channel transistor 82 that function as pull-down transistors, and an N channel transistor 84 and an N channel transistor 86 that function as pass transistors. Transistor 76 has a source connected to a positive power supply terminal which is often referenced as VDD, a gate, and a drain. Transistor 78 has a source connected to the positive power supply terminal, a drain connected to the gate of transistor 76, and a gate connected to the drain of transistor 76. Transistor 80 has a gate connected to the gate of transistor 76, a source connected to a negative power supply terminal that may be ground, and a drain connected to the drain of transistor 76. Transistor 82 has a gate connected to the gate of transistor 78, a source connected to the negative power supply terminal, and a drain connected to the drain of transistor 78. Transistor 84 has a gate connected to word line WL0, a first source/drain connected to bit line BL0, and a second source/drain connected to the drains of transistors 76 and 80. Transistor 86 has a gate connected to word line WL0, a first source/drain connected to complementary bit line BLB0, and a second source/drain connected to the drains of transistors 78 and 82. Control memory cells 36 and 38 each include a conventional SRAM cell coupled to write word lines CWWL0 and CWWL1, respectively, and to write bit lines WBL and WBLB and further include a pair of additional transistors used in providing an output responsive to the word line of the row of which they are a part. Control memory cell 36 is in the same row as memory cells 28 and 30. For example, control memory cell 36 comprises transistors 88, 90, 92, 94, 98, and 100 that are connected to each other in the same manner as transistors 76, 78, 80, 82, 84, and 86, respectively. Control memory cell further includes N channel transistors 112 and 114. Transistor 112 has a drain connected to sense amplifier control line SA_CNTRL, a gate connected to word line WL0, and a source. Transistor 114 has a drain connected to the source of transistor 112, a gate connected to the drains of transistors 90 and 94, and a source connected to the negative power supply terminal. Variable delay inverter 127 has an input connected to sense amplifier control line SA_CNTRL and an output connected to sense amplifiers 40 and 42.

Sense amplifier circuit 16 comprises sense amplifiers 40 and 42 as shown in FIG. 1 is conventional and works in conjunction with conventional precharge and column. Sense amplifier 40 comprises P channel transistors 102 and 104 and N channel transistors 106, 108, and 110. They function as a pair of cross-coupled inverters comprising an inverter of transistors 102 and 106 and an inverter of transistors 104 and 108 that is enabled or disabled through transistor 110. When the output of variable delay inverter 127 is a logic high, transistor 110 is conductive enabling sense amplifier 40. Sense amplifier 42 is enabled in the same way. Similarly, sense amplifiers 40 and 42 are disabled when the output of variable delay inverter 127 is a logic low. The actual delay provided by variable delay inverter 127 is for optimizing the timing for sensing by sense amplifiers 48 and 50. The delay, for example, may be set during test so that it is not variable after that or may be left variable longer than that. The functional block called word line driver control logic 13 also provides isolation between bit lines and second bit lines through controlling transistors 52, 54, 56, and 58 of column coupler circuit 22 as well as other transistors not shown coupled to other bit line pairs not shown. Word line driver control logic is responsive to a clock CLK, and address ADDRESS, and a control CNTRL. Writer driver logic is 11 receives data to be written onto the bit lines such as shown bit lines WBL, WBLB, BL0, BLB0, BLn, and BLBN.

In operation, control memory cells 14 are set or cleared to identify if the memory cells along a word line are to be sensed. For example, if the memory cells of word line WL0 are to be sensed, then control memory cell is written to the set condition which is the condition achieved by applying a logic high to word line WBL while applying a logic high to control write word line CWWL0 which results in a logic high being stored at the drains of transistors 90 and 94 which has the effect of making transistor 114 conductive. In preparation for a read, sense amplifier control line SA_CNTRL is precharged to a logic high in response to precharge signal PCH_B being asserted, which is a logic low, and received by transistor 120. Latch 122 keeps the logic high at sense amplifier control line SA_CNTRL after precharge signal PCH_B is deasserted. With a logic high on sense amplifier control line SA_CNTRL, variable delay inverter 127 applies a logic low to sense amplifiers 40 and 42 so that they are then in a disabled condition. When word line WL0 is activated, which is a logic high, then transistor 112 responds by becoming conductive which causes sense amplifier control line SA_CNTRL to become a logic low. In response to sense amplifier control line SA_CNTRL becoming a logic low, variable delay inverter 127 outputs a logic high which enables sense amplifiers 40 and 42 some delay time after memory cells have been enabled by word line SL0 switching to a logic high. This delay is selected to optimize the point at which sensing should begin. Optimizing typically means reliably achieving the fastest read time. If the delay is too short, the signal on the bit lines may not be sufficiently developed and the wrong state may be latched by the sense amplifier. Thus, the typical goal is to make the delay only as long as necessary to avoid this latching to the wrong the state over all the conditions the memory will face such as the range of power supply voltages and the range of temperatures. The delay in this case includes, for example, the delay associated with transistor 112 bringing sense amplifier control line SA_CNTRL to a logic low, which includes taking into account the response time of transistor 112, the drive of transistor 112, the capacitance of sense amplifier control line SA_CNTRL, and the effect of latch 122. Variable delay inverter 127 adds the selectable delay required to achieve the overall desired delay.

For the case where the memory cells of word line WL0 are not to be sensed, control memory cell 36 is cleared by applying a logic low to write bit line WBL and a logic high to complementary write bit line WBLB while applying a logic high to control write word line CWWL0 which results in a logic low being stored at the drains of transistors 90 and 94. This has the effect of transistor 114 being non-conductive. In preparation for a read, sense amplifier control line SA_CNTRL is precharged and latched to a logic high which results in variable delay inverter providing a logic low output which disables sense amplifiers 40 and 42. When word line WL0 switches to a logic high, transistor 112 becomes conductive but transistor 114 remains non-conductive so that sense amplifier control line SA_CNTRL remains at the logic high condition so that the output of variable delay inverter 127 continues to provide a logic low output which keeps sense amplifiers 40 and 42 disabled. The effect is that the word line that has been identified as not to be read is not read and in particular the sense amplifiers are not enabled. The sense amplifiers being enabled, which can be a large number, for example, in the case of a TAG of a cache in which all of the memory cells along the word line are typically read. Also there is substantially no effect on the speed of a normal read. There is an additional column made up of the control memory cells which does increase the length of the word line slightly. The techniques usually associated with disabling a read are directed to disabling the word line. Those techniques generally create a more significant delay for a normal read. Thus, this approach shown in FIG. 1 provides for the benefit of reduced power, especially the elimination of a major current peak that occurs when the sense amplifiers become enabled, for the case where it can be anticipated that the attempted read is not necessary. Continuing with the example of a TAG, it is common for reads to occur of cells along a word line in which it is known that the results of the read will not be used.

Figure 2:
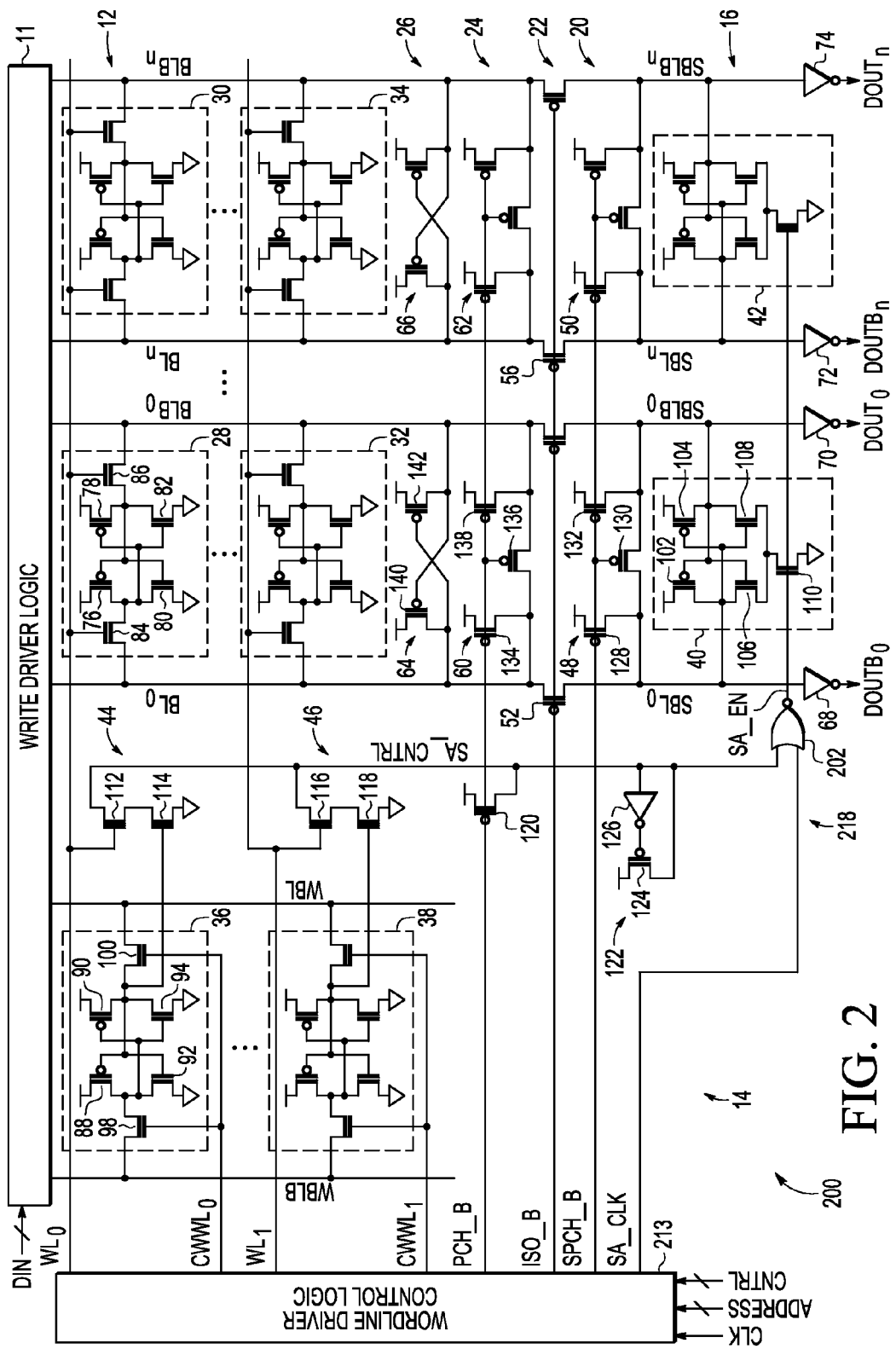
FIG. 2 is a circuit diagram of a memory according to a second embodiment that has many of the same elements as the first embodiment.

Shown in FIG. 2 is a memory 200 that has the same elements as memory 10 of FIG. 1 except word line driver control logic 13 is replaced by word line driver control logic 213 and variable delay inverter 127 is replaced by NOR gate 202 whereby sense amplifier enable circuit 18 is replaced by sense amplifier enable circuit 218. Sense amplifier enable circuit 218 has NOR gate 202 instead of variable delay inverter 127. Word line control logic 213 provides all of the functionality of word line driver control logic 13 plus provides a sense amplifier clock signal SA_CLK that provides the timing for enabling the sense amplifiers. NOR gate has a first input connected to sense amplifier control line SA_CNTRL, a second input that receives the sense amplifier clock signal SA_CLK, and an output sense amplifier enable SA_EN that is coupled to the sense amplifiers in the same way as the output of variable delay inverter 127. The elements in common between memory 10 and memory 200 operate in the same way and have the same reference numerals.

In operation then, using the example for control memory cell 36 as used in the description of memory 10, when control memory cell 36 is set, it provides a logic high to transistor 114 which keeps transistor 114 conductive. Prior to a word line selection, word line WL0 is a logic low so that transistor 112 is non-conductive. Transistor 120 precharges sense amplifier control line SA_CNTRL to a logic high and latch 122 keeps sense amplifier control line SA_CNTRL a logic high. The first input of NOR gate 202 is thus a logic high which forces NOR gate 202 to provide a logic low output keeping sense amplifiers 40 and 42 disabled. Word line driver control logic 213 provides sense amplifier clock signal SA-CLK at a logic high prior to word line selection so that both inputs to NOR gate are a logic high. When word line WL0 is selected, word line WL0 switches to a logic high which causes transistor 112 to become conductive and causing sense amplifier control line SA_CNTRL to a switch to a logic low. Sense amplifier clock signal SA_CLK is still a logic high so that the output of NOR gate 202 is still a logic low, keeping sense amplifiers 40 and 42 disabled. Word line control logic provides for the timing of sense amplifier clock signal SA_CLK to optimize the timing of the enabling of sense amplifiers 40 and 42. When sense amplifier clock signal SA_CLK switches to a logic low, the second input of NOR gate 202 becomes a logic low which causes the output of NOR gate to switch to a logic high so the sense amplifier enable signal SA_EN is a logic high, enabling sense amplifiers 40 and 42.

For the case where control memory cell 36 has been cleared, the drains of transistors 90 and 94 is a logic low which results in transistor 114 being non-conductive. Prior to a word line selection sense amplifier control line SA_CNTRL is precharged and latched to a logic high causing the first input of NOR gate 202 to be a logic high which forces sense amplifier enable signal SA_EN to be a logic low, keeping sense amplifiers 40 and 42 disabled. When word line WL0 switches to a logic high which causes transistor 112 to become conductive, With transistor 114 non-conductive due to control memory cell being cleared, sense amplifier control line SA_CNTRL stays a logic high so that NOR gate continues to hold sense amplifier enable signal SA_EN at a logic low. When sense amplifier clock SA_CLK switches to a logic low, NOR gate 202 continues to hold sense amplifier enable signal SA_EN at a logic low, keeping sense amplifiers 40 and 42 disabled.

The operation of both memory 10 and memory 200 includes preventing sense amplifiers from being enabled through the word line when a control memory cell has been cleared. In effect a logic high is coupled to sense amplifier control line SA_CNTRL when the word line is enabled by coupling a non-conductive transistor, transistor 114 when control memory 36 is cleared, to sense amplifier control line SA_CNTRL, and a logic low is coupled to sense amplifier control line SA_CNTRL by coupling a conductive transistor, transistor 114 when control memory 114 is set, to sense amplifier control line SA_CNTRL. In both cases, the disabling or enabling of the sense amplifiers may be considered to be determined in response to the word line becoming active.

Figure 3:
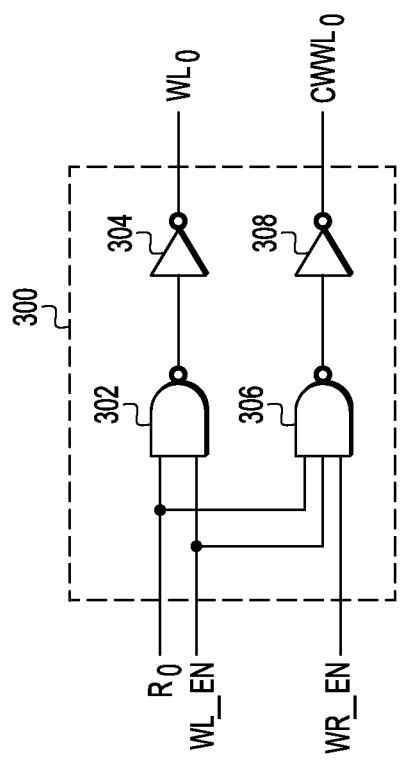
FIG. 3 is a circuit diagram of a word line driver for use in the memories of FIGS. 1 and 2.

Shown in FIG. 3 is a write driver 300 within word line driver control logic 213 of FIG. 2 and word line driver control logic 13 of FIG. 1 comprising a NAND gate 302, an inverter 304, a NAND gate 306, and an inverter 308. Write driver 300, as an example of a word line driver for each of the rows, provides the word line signal on word line WL0 and the control write word line signal on control write word line CWWL0. NAND gate 302 has a first input for receiving a row select signal R0 derived from a row address, a second input for receiving a word line enable signal WL_EN, and an output. Inverter 304 has an input connected to the output of NAND gate 302 and an output connected to word line WL0 which is shown in FIGS. 1 and 2. NAND gate 306 has an first input for receiving row select R0 signal, a second input for receiving word line enable signal WL_EN, a third input for receiving a write enable signal WREN. In operation, word line WL is selected when row signal R0 is a logic high when word line enable WL_EN switches to a logic high. Similarly, control word line CWWL0 is selected when row signal R0 is a logic high, write enable signal WR_EN is a logic high, and word line enable signal WR_EN switches to a logic high.

By now it should be appreciated that there has been provided a memory device having a plurality of sense amplifiers and an array of memory cells including a first subset of memory cells. The memory device further includes a plurality of word lines, wherein each word line is coupled to each memory cell in a respective row of the memory cells and each row of the memory cells includes one memory cell of the first subset of memory cells. The memory device further includes a plurality of control word lines, wherein each control word line is coupled to a respective one of the memory cells in the first subset of memory cells and each of the memory cells in the first subset of memory cells generates a sense amplifier control signal coupled to control operation of a respective one of the plurality of sense amplifiers. The memory device may further include a second subset of memory cells in the array of memory cells, wherein the second subset of memory cells store data. The memory device may have a further characterization by which each of the memory cells in the first subset of memory cells controls access to a respective row of the second subset of memory cells. The memory device may have a further characterization by which each of the memory cells in the first subset of memory cells includes a first inverter, a second inverter, wherein an output of the first inverter is coupled to an input of the second inverter, and an output of the second inverter is coupled to an input of the first inverter, a pull-down circuit including a first transistor and a second transistor, the first transistor having a control electrode coupled to the output of the second inverter, and a first current electrode coupled to ground, the second transistor having a control electrode coupled to a respective one of the word lines, a first current electrode coupled to a second current electrode of the first transistor, and a second current electrode coupled to the respective one of the sense amplifiers. The memory device may further include a first pass transistor having a first electrode coupled between the output of the first inverter and the input of the second inverter, a second electrode coupled to a complementary write bit line, and a control electrode coupled to a respective one of the control word lines and a second pass transistor having a first electrode coupled between the output of the second inverter and the input of the first inverter, a second electrode coupled to a write bit line, and a control electrode coupled to the respective one of the control word lines. The memory device may further include a logic gate having a first input coupled to the sense amplifier control signal, a second input coupled to a sense amplifier clock signal, and an output coupled to the respective one of the plurality of sense amplifiers. The memory device may further include a variable delay inverter having an input coupled to the sense amplifier control signal and an output coupled to the respective one of the plurality of sense amplifiers. The memory device may further include a word line driver circuit configured to provide the plurality of word line signals and the plurality of control word line signals. The memory device may have a further characterization by which the sense amplifier control signal is coupled to control operation of the plurality of sense amplifiers.

Also described is a memory device having a plurality of word lines. The memory device further includes an array of memory cells including control memory cells and data storage memory cells, one of the control memory cells and at least one data storage memory cells coupled to each of a respective one of the plurality of word lines, the control memory cells are in one of a first state and a second state when a respective word line is selected. The memory device further includes a sense amplifier, the sense amplifier is enabled to read data from the data storage memory cells along a selected word line when the control memory cell of the selected word line is in the first state and the sense amplifier is disabled from reading data from the at least one data storage memory cell along the selected word line when the control memory cell of the selected memory cell is in the second state. The memory device may further include an inverter having an input coupled to output of the control memory cells and an output coupled to the sense amplifier. The memory device may further include a logic gate having a first input coupled to output of the control memory cells, a second input coupled to a sense amplifier clock signal, and an output coupled to the sense amplifier. The memory device may further include a plurality of control word lines, each of the plurality of control word lines is coupled to a respective one of the control memory cells. The memory device may further include a word line driver circuit configured to provide signals to the plurality of word lines and the plurality of control word lines. The memory device may have a further characterization by which the word line driver circuit further includes a first logic gate having a first input coupled to a row decode signal, a second input coupled to a word line enable signal and an output coupled to a respective one of the plurality of word lines and a second logic gate having a first input coupled to the row decode signal, a second input coupled to the word line enable signal, a third input coupled to a write enable signal and an output coupled to a respective one of the plurality of control word lines.

Described also is a method of operating a memory device having a memory array that includes a plurality of word lines coupled to control memory cells and data storage memory cells. The method includes providing a first word line signal and a control word line signal to one of the control memory cells, wherein the one of the control memory cells and at least one of the data storage memory cells is coupled to a first word line. The method further includes, if the control memory cell is in a first state, disabling a sense amplifier coupled to the one of the control memory cells. The method further includes, if the control memory cell is in a second state, enabling the sense amplifier coupled to the one of the control memory cells. The method may further include setting the first word line signal based on a row decode signal and a word line enable signal. The method may further include setting the control word line signal based on a write enable signal, a row decode signal and a word line enable signal. The method may further include, if the control memory cell is in a first state, disabling the sense amplifier before power is used by the sense amplifier to access the at least one of the data storage memory cells. The method may further include using the control word line signal to control operation of pass transistors coupled to cross-coupled inverters in the one of the control memory cells.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, other techniques than those shown may be found to be effective in providing the disabling of the sense amplifiers in response to the word line being enabled. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:
1. A memory device comprising:
a plurality of sense amplifiers each coupled to a sense amplifier control line;
an array of memory cells including a first subset of memory cells;
a plurality of word lines, wherein each word line is coupled to each memory cell in a respective row of the memory cells and each row of the memory cells includes one memory cell of the first subset of memory cells; and
a plurality of control word lines, wherein each control word line is coupled to a respective one of the memory cells in the first subset of memory cells, and each of the memory cells in the first subset of memory cells stores a first state to generate a sense amplifier control signal on the sense amplifier control line that enables operation of a respective one of the plurality of sense amplifiers and stores a second state to generate the sense amplifier control signal on the sense amplifier control line that disables operation of the respective one of the plurality of sense amplifiers.

2. The device of claim 1 further comprising:
a second subset of memory cells in the array of memory cells, wherein the second subset of memory cells store data.

3. The device of claim 2 wherein:
each of the memory cells in the first subset of memory cells controls access to a respective row of the second subset of memory cells.

4. The device of claim 1, wherein each of the memory cells in the first subset of memory cells includes:
a first inverter;
a second inverter, wherein an output of the first inverter is coupled to an input of the second inverter, and an output of the second inverter is coupled to an input of the first inverter; and
a pull-down circuit including a first transistor and a second transistor,
the first transistor having a control electrode coupled to the output of the second inverter, and a first current electrode coupled to ground,
the second transistor having a control electrode coupled to a respective one of the word lines, a first current electrode coupled to a second current electrode of the first transistor, and a second current electrode coupled to the respective one of the sense amplifiers.

5. The device of claim 4 further comprising:
a first pass transistor having a first electrode coupled between the output of the first inverter and the input of the second inverter, a second electrode coupled to a complementary write bit line, and a control electrode coupled to a respective one of the control word lines;
a second pass transistor having a first electrode coupled between the output of the second inverter and the input of the first inverter, a second electrode coupled to a write bit line, and a control electrode coupled to the respective one of the control word lines.

6. The device of claim 1 further comprising:
a logic gate having a first input coupled to the sense amplifier control signal, a second input coupled to a sense amplifier clock signal, and an output coupled to the respective one of the plurality of sense amplifiers.

7. The device of claim 1 further comprising:
a variable delay inverter having an input coupled to the sense amplifier control signal and an output coupled to the respective one of the plurality of sense amplifiers.

8. The device of claim 1 further comprising:
a word line driver circuit configured to provide the plurality of word line signals and the plurality of control word line signals.

9. The device of claim 1 wherein the sense amplifier control signal is coupled to control operation of the plurality of sense amplifiers.

10. A memory device comprising:
a plurality of word lines;
an array of memory cells including control memory cells and data storage memory cells, one of the control memory cells and at least one data storage memory cells coupled to each of a respective one of the plurality of word lines, the control memory cells store one of a first state and a second state when a respective word line is selected; and
a sense amplifier, the sense amplifier is enabled to read data from the data storage memory cells along a selected word line when the control memory cell of the selected word line stores the first state and the sense amplifier is disabled from reading data from the at least one data storage memory cell along the selected word line when the control memory cell of the selected memory cell stores the second state.

11. The device of claim 10 further comprising:
an inverter having an input coupled to output of the control memory cells and an output coupled to the sense amplifier.

12. The device of claim 10 further comprising:
a logic gate having a first input coupled to output of the control memory cells, a second input coupled to a sense amplifier clock signal, and an output coupled to the sense amplifier.

13. The device of claim 10 further comprising:
a plurality of control word lines, each of the plurality of control word lines is coupled to a respective one of the control memory cells.

14. The device of claim 13 further comprising:
a word line driver circuit configured to provide signals to the plurality of word lines and the plurality of control word lines.

15. The device of claim 14, wherein the word line driver circuit further comprises:
a first logic gate having a first input coupled to a row decode signal, a second input coupled to a word line enable signal and an output coupled to a respective one of the plurality of word lines; and
a second logic gate having a first input coupled to the row decode signal, a second input coupled to the word line enable signal, a third input coupled to a write enable signal and an output coupled to a respective one of the plurality of control word lines.

16. A method of operating a memory device having a memory array that includes a plurality of word lines coupled to control memory cells and data storage memory cells, the method comprising:
providing a first word line signal and a control word line signal to one of the control memory cells, wherein the one of the control memory cells and at least one of the data storage memory cells is coupled to a first word line;
if the control memory cell stores a first state, disabling a sense amplifier coupled to the one of the control memory cells; and
if the control memory cell stores a second state, enabling the sense amplifier coupled to the one of the control memory cells.

17. The method of claim 16 further comprising:
setting the first word line signal based on a row decode signal and a word line enable signal.

18. The method of claim 16 further comprising:
setting the control word line signal based on a write enable signal, a row decode signal and a word line enable signal.

19. The method of claim 16 further comprising:
if the control memory cell is in a first state, disabling the sense amplifier before power is used by the sense amplifier to access the at least one of the data storage memory cells.

20. The method of claim 16 further comprising:
using the control word line signal to control operation of pass transistors coupled to cross-coupled inverters in the one of the control memory cells.

* * * * *